United States Patent [19]

Bonneron

[11] 4,387,153
[45] Jun. 7, 1983

[54] DRY TRANSFER PROCESS WHICH EMPLOYS ULTRAVIOLET LIGHT AND PHOTOSENSITIVE MATERIALS

[75] Inventor: Mark P. Bonneron, Amsterdam, Netherlands

[73] Assignee: Mecanorma S.A., Paris, France

[21] Appl. No.: 311,862

[22] Filed: Oct. 15, 1981

[30] Foreign Application Priority Data

Apr. 13, 1981 [FR] France .............................. 81 07333

[51] Int. Cl.³ .......................... G03C 1/48; G03C 5/54
[52] U.S. Cl. .................................. 430/200; 430/199; 430/211; 430/235; 430/253
[58] Field of Search ............... 430/200, 253, 199, 211, 430/235

[56] References Cited

U.S. PATENT DOCUMENTS 3,451,338  6/1969  Baum ................................. 430/348
3,484,238  12/1969  Fox ..................................... 430/199
3,951,658  4/1976  Marsh et al. ........................ 430/211

Primary Examiner—Richard L. Schilling
Attorney, Agent, or Firm—Staas & Halsey

[57] ABSTRACT

The invention relates to a dry transfer process which employs ultraviolet light and photosensitive materials.

The transfer materials used comprise a donor complex layer (c) and a receptor layer (c1). The donor complex layer (c) comprises a carrier (1), a priming layer (2), signs or imprints (3) produced by means of a colorless color-producing material, and a barrier layer (4) which is degradable under the action of ultraviolet light. The receptor layer (c1) comprises a carrier 6 coated with a layer (5) comprising a color developer.

The transferred symbols or images (7) are obtained without the physical passage of an element or of an image from the donor layer to the receptor layer; their quality is comparable to that of printed characters.

11 Claims, 4 Drawing Figures

DRY TRANSFER PROCESS WHICH EMPLOYS ULTRAVIOLET LIGHT AND PHOTOSENSITIVE MATERIALS

This invention relates to a dry transfer material of the kind which utilises chemical complexes having photosensitive properties and suitable for performing a transfer utilising a chemical reaction under predetermined conditions.

BACKGROUND TO THE INVENTION

Several processes are already known for carrying out a dry transfer.

First of all, transfer techniques are known which make use of a paper or carrier provided with micro-capsules containing a printing liquid. When a mechanical stress is applied to such a carrier, it causes the microcapsules to burst, the printing liquid thus being released and so effecting the printing or transfer operation.

Mechanical transfer methods are also known which make use of a carrier having the symbols or patterns which are to be transferred adhering thereto. In this case, the transfer is a true physical transfer of the symbol or pattern from its initial carrier to the receiving carrier. The operation is performed by placing the surface of the initial carrier bearing the symbol or pattern in contact with a receiving carrier and then applying mechanical pressure to the other surface of the initial carrier, for example, by rubbing the surface in question with a pen or scriber.

Processes are also known which make use of the properties of photopolymerisation of particular chemical compounds. Use is made of a donor which carries the symbols which are to be transferred and a coating of a photopolymerisable compound, and of an acceptor on to which the transfer is to be made and which carries a coating of another photosensitive compound. Under the action of light, chemical photopolymerisation reactions occur under particular conditions and which may depend upon the wavelengths of the incident light. These reactions lead to a differential adhesion effect. The symbols or parts which are to be transferred then adhere more strongly to the acceptor than to the donor, and are transferred. The parts which are not to be transferred adhere more strongly to the donor than to the acceptor and are retained on the donor and are not transferred.

The processes referred to above render it possible to perform a transfer by the physical passage of a tangible symbol or element from an initial carrier to which they are initially attached, to an acceptor. This element consists of an ink in the case of processes which make use of microcapsules; it consists of the symbol itself, which is to be transferred, in the other cases.

Processes of colour transfer by thermography are described, for example, in British Pat. No. 953,150 and in U.S. Pat. No. 3,451,338. In these processes, use is made of a chromogenic or colour-producing substance, consisting of a compound of the benzo-indolino-spiropyrane series, which is colourless and translucent in the normal state. When this substance comes into contact with a developer, it becomes coloured and opaque. In accordance with the British patent, the developer consists of a salt of an organic acid whilst according to the U.S. patent, the developer consists of a phenolic compound. The reaction between the chromogenic substance and the developer is effected by the application of heat, for example, by means of infrared radiation.

According to these patents, the chromogenic substance and the developer are mixed with a bonding polymer and deposited upon a carrier, for example, a sheet of paper, in the form of a coating. The transfer of a sign or symbol is effected as a result of the imprint of said sign or symbol in a thermographic ink upon the back of a carrier sheet or upon a template sheet placed in contact with the active coating. Upon exposure to infrared radiation, the thermographic ink selectively absorbs heat and this brings about a chemical reaction between the chromogenic substance and the developer in the corresponding areas of the active coating.

According to another form of procedure disclosed in U.S. Pat. No. 3,451,338, the chromogenic substance and the developer form coatings upon the contacting surfaces of two carrier sheets, one of which comprises one or more signs printed in thermographic ink. Upon heating by infrared radiation or by means of a heating panel (FIG. 4 of the said U.S. patent), the phenolic compound melts in those areas which correspond to the imprint of the thermographic ink and a chemical reaction occurs with the chromogenic substance so that the sign or symbol is printed upon one coating or the other. The migration of the one or the other substance of the reaction is referred to in the said U.S. patent, but it is not explained or analysed in any way.

The process disclosed in British Pat. No. 953,150 found very widespread application in the form of a carrier sheet provided with a single coating comprising both reactive materials, the chromogenic substance and the developer, in an intimate admixture, and on which it is consequently possible to write symbols or letters in colour using a heated scriber or heated characters. This material is utilised on a very large scale at present in printers for cash registers and for computers.

By contrast, if the two reactive materials are situated on two separate sheets and the reaction is brought about by infrared radiation or a heating panel, it was found that the application of a model or pattern of the sign to be transferred in thermographic ink, is essential to secure a useful result. Furthermore, the use of infrared radiation involves a dissipation of heat in all cases, which cannot be rectified and causes accidental transfer of symbols and an absence of clarity in the transferred symbols, which is unacceptable.

The object of the present invention is to provide a transfer material comprising a chromogenic or colour-producing substance and a developer each of which is deposited upon a separate carrier and in which the chemical reaction is brought about by an input of extraneous energy which does not involve any dissipation of heat and permits a perfect transfer of the chromogenic substance on to the carrier of the developer and thus to obtain symbols of perfect clarity.

SUMMARY OF THE INVENTION

The transfer material in accordance with the invention is of the kind which comprises a donor complex comprising an inert carrier provided with a colour-producing coating containing a chromogenic substance, and a receptor complex comprising an inert carrier provided with a coating of a colour developer, and in which the chromogenic substance may be a substance of the benzo-indolino-spiropyran group which emits electrons, and the developer comprises an electron-accepting phenolic compound.

According to the invention, the said colour-producing coating is deposited in the form of signs or symbols which are to be transferred, and this is covered by a barrier layer which is degradable by the action of ultraviolet light of predetermined wavelength, an attenuating layer sensitive to the ultraviolet light being interposed between the said colour-producing coating and the carrier of the said donor complex, and at least one of the said carriers is transparent to ultraviolet light.

To use this material, the donor complex and the receptor complex are placed with their coated surfaces one above the other, and they are then exposed to the action of ultraviolet light of predetermined wavelength. When this is done, the attenuator layer and the barrier layer are degraded or eliminated by the action of the ultraviolet light which brings about a localised exothermic reaction at the irradiated surface which ensures that the colour-producing coating comes into contact with the colour developer and produces an image on the receptor element carrier which corresponds to that formed initially by the colour-producing coating. As a result of this procedure, a transfer is brought about without the risk of heat dissipation and thus produces symbols or signs of perfect clarity.

The said chromogenic substance preferably consists of at least one member of the Benzo-Indolino-Spiropyran series which is wholly transparent to ultraviolet light.

To speed up the image transfer of the material used in accordance with the invention, the said colour producing coating additionally comprises a bonding polymer for the purpose of activating the photopolymerisation whilst the said colour developer additionally comprises a zinc compound which acts as a photoactivator.

According to a preferred formulation of the material used according to the invention, the said colour-producing coating additionally comprises a standard dyestuff which bleaches colour under the action of ultraviolet light. This makes it possible for the location of the symbols or characters already transferred to be ascertained immediately.

In addition, in accordance with the invention, the attenuator layer and the barrier layer may each comprise photo-initiators and photo-activators which increase the speed of transfer.

The donor complex and the receptor complex may be produced by application of a roller in accordance with known procedure.

According to one embodiment of the invention, the receptor complex carrier comprises an optionally smooth surface upon which the colour developer coating is deposited, preferably as fine particles of the aerosol type. This offers a considerable advantage since the symbols may thus be transferred to a carrier of a known kind, for example, a panel or wall.

The invention additionally provides a process for the use of the material described above, which comprises placing the surfaces coated with the said donor complex and the said receptor complex in mutual contact and then exposing the whole to ultraviolet light of predetermined wavelength incident upon the side of the carrier which is transparent to ultraviolet light. Ultraviolet light having a wavelength of the order of 254 to 430 nm is preferably used.

The invention also includes a device for carrying out this process using a material in accordance with the invention. This device comprises a first supporting frame intended to receive the donor complex and which is displaceably mounted in a horizontal plane in two directions at right angles to one another, a second supporting frame located above said first supporting frame and in close proximity to the latter which is intended to receive the receptor complex, said second frame being arranged to be displaceable in a horizontal plane along at least one of the two aforesaid directions, a source of ultraviolet light disposed above or below the said frames and which provides a beam of radiation covering a predetermined area within the second supporting frame, control means enabling positioning said second frame relative to the source of ultraviolet light, means for positioning the first frame relative to the second frame, and means for intermittent activation of the source of ultraviolet light.

BRIEF DESCRIPTION OF THE DRAWINGS

Other embodiments and advantages of the invention will become apparent from the following description and the accompanying drawings which illustrate a preferred embodiment of the transfer material in accordance with this invention and of a device for the use of this material. In the drawings.

DETAILED DESCRIPTION OF PREFERRED EMBODIMENTS

Figure 1:
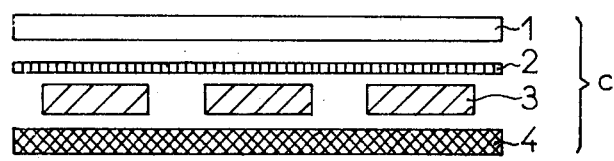
FIG. 1 is a diagrammatic view in cross-section of the donor complex in accordance with the invention.
Figure 2:
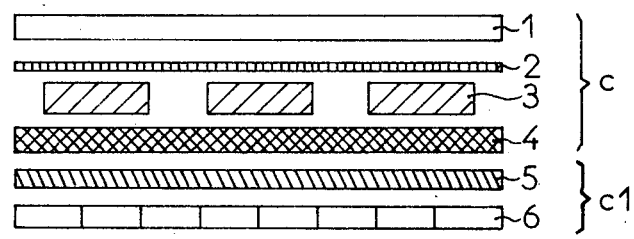
FIG. 2 is a diagrammatic view in cross-section of the donor complex illustrated in FIG. 1 and of a receptor complex in accordance with the invention prior to exposure to ultraviolet light.
Figure 3:
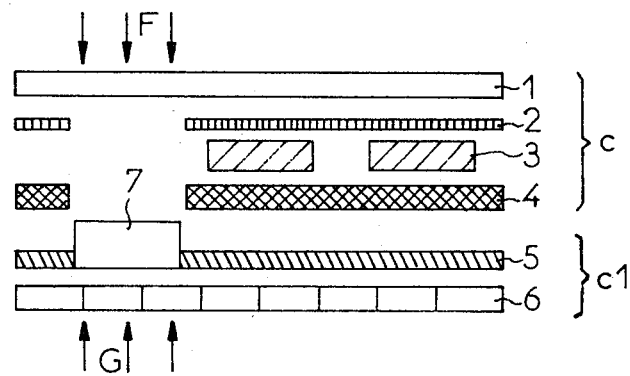
FIG. 3 is a diagrammatic view in cross-section of the donor complex and of the receptor complex illustrated in FIG. 2 after exposure to ultraviolet light.

The donor complex c illustrated in FIGS. 1 to 3 comprises a carrier sheet 1 upon which are deposited an attenuator layer 2, a layer 3 comprising signs or symbols which are to be transferred and formed by printing with a chromogenic or colour-producing substance and a barrier layer or element 4 which is degradable under the action of ultraviolet light thus enabling the transfer of the signs or symbols 3 to a receptor complex c1 (FIGS. 2 and 3).

The receptor complex c1 comprises a carrier sheet 6 upon which is deposited a layer 5 comprising a colour developer.

The composition and action of each of the layers 1 to 6 forming the donor material c and the receptor material c1 in accordance with the invention, will now be described.

I. Carrier 1 of the donor complex c

The carrier 1 comprises a sheet or film of rigid or flexible material, which is transparent or translucent and permits the passage of ultraviolet light of short wavelength, preferably comprising wavelengths between 254 and 430 nanometers.

The gauge of this sheet or film is preferably of the order of 30 to 100 microns and the tensile strength thereof is equal to or exceeds 1300 Kgs/cm$^2$. The film or sheet 1 will preferably permit at least 80% of the incident energy to pass in the form of ultraviolet light.

For production of the film or sheet 1, it is possible to make use of a polyester, polyethylene, polyethylene terephthalate such as that sold under the trade name Melinex O or S by I.C.I. Ltd. polystyrene, polypropylene, a regenerated cellulose, polyvinylidene chloride, nylon or other similar materials.

The use of a film of polyethylene is particularly effective with regard to the transmission of ultraviolet light having a wavelength equal to or greater than 254 nm.

Before receiving the other layers 2,3,4, the film or sheet may be processed mechanically or chemically in order to permit better bonding to the priming layer 2.

II. The Priming Layer 2

The priming layer 2 comprises photosensitive substances and a bonding agent. The photosensitive substances comprise photo-initiators and/or photo-activators. The action of ultraviolet light on these photosensitive substances brings about changes in the mechanical and chemical properties thereof and in particular brings about an ionic photopolymerisation reaction.

According to this invention, the layer 2 comprises a mixture of co-polymers of polyvinyl-pyrrolidone/-maleic anhydride and of a polyvinyl alcohol in which is dispersed a photoinitiator or a mixture of such materials. By way of example, it is possible to use one or more of the following substances as photo-initiators: 2-hydroxy-2-methyl-1-phenyl-propane-1-one (DAROCUR 1173 Merck), 1-(4-isopropylphenyl)-2-hydroxy-2-methylpropane-1-one (DAROCUR 1116-Merck), 2-isopropylthioxanthone (QUANTACURE ITX), 13% by weight 2-isopropylthioxanthone dissolved in 2-(dimethylamino)ethyl benzoate (QUANTACURE 659), or benzyldimethylketone (IRGACURE 651).

The photoactivators of the priming layer 2 comprise one or more of the following substances: benzophenone, 4,4'-bis-dimethylamino-benzophenone, ethyl 4-dimethylaminobenzoate, benzyl, 2-chlorothioxanthone and 2-ethylanthraquinone.

Under the action of ultraviolet light of specific wavelength, these photo-initiators make it possible to bring about a photopolymerisation with acrylic oligomers or copolymers which are a constituent of the barrier layer 4. The presence of vinyl polymers, especially of vinyl pyrrolidones, makes it possible to activate the photopolymerisation of the acrylic oligomers.

The priming layer 2 has three principal functions. Firstly, it makes it possible to isolate the symbols or imprints produced by means of the colour-producing substance 3 from the carrier sheet 1, and enables the correct printing of these symbols or imprints. Subsequently it protects this same substance 3 against pressures or accidental stresses exerted upon the complex as a whole. Finally, the priming layer 2 makes it possible to improve the reaction between the colour-producing compound and the reactive colour developer on the receptor carrier. In some manner, it activates the compounds present in layer 3 so that they react more rapidly and more completely with those of the colour developer after the action of the ultraviolet light. It acts in the manner of a synergetic material by increasing the reactivity of the electron interchange between the colour-producing compound 3 and its developer 5.

III. Colour-producing layer 3

The layer 3 of the donor complex c comprises symbols, signs or characters intended to be transferred onto the receptor complex c1 and which have been formed on the layer 2 by a known printing process, for example, by silk screen printing.

These symbols or signs are produced using a chromogenic or colour-producing substance comprising a colourless organic product which is stable at different pH values and which emits electrons. This substance becomes coloured when it is brought into contact with an electron-accepting developer.

The chromogenic substance may consist of phthalides, fluorans, benzofluorans, chromenopyrazols, spiropyrans, spiro di-pyrans, azomethines and a carbazolymethane, a chromenoindole, a phenoxazine, a phenothiazine or a leuco-antamine. It preferably consists of one or more dyestuffs of the benzo-indolinospiropyrane series.

Among these latter dyestuffs, one or more of the following substances are preferably used: 1,3,3-trimethyl-6'-chloro-8'-methoxy-indolino-benzo-spiropyran, 3,3-bis-indolyl-phthalide, 3-(aminophenyl)-3-indolyl-phthalide, 6-dialkylamino-2-n-octylamino-fluorane, 6-dialkylamino-2-arylamino-fluorane, 6-dialkylamino-3-methyl-2-arylamino-fluorane, 6-dialkylamino-2 or 3-alkyl-fluorane, 6-dialkylamino-2-dibenzylaminofluorane, 6-pyrolidono-2-arylamino-fluorane, bis-(aminophenyl)-furyl- or phenyl- or carbazolyl-methane, benzoyl leucomethylene blue (BLMB), 3-phenyl-7-dialkylamino-2-, 2-di-spirobenzopyran, benzoyldialkylamino-phenothiazine or phenoxazine or bis-dialkylamino-benzydrolarysulphonate or Crystal violet lactone (CVL).

In addition, according to a preferred embodiment of the invention, the chromogenic layer comprises a standard dyestuff compatible with the chromogenic colourants, which dyestuff bleaches upon exposure to ultraviolet light. This renders it possible to render visible the characters or symbols which have been printed with the material of the layer 3. The bleaching of the standard dyestuff upon exposure to ultraviolet light facilitates the use of the material in accordance with the invention since it enables the location of the characters already transferred to be determined.

The layer 3 also comprises a bonding polymer which likewise serves to activate the photopolymerisation process. This bonding agent may comprise one or more of the following substances: vinyl acetate-2-ethylhexyl acrylate copolymer, isobutylene copolymer, polybutyl acrylate, ethylhexyl acrylate, iso-octyl acrylate, ethyl methacrylate, 2-ethylhexyl acrylate, dimethylaminoethyl methacrylate, diacetone acrylamide, 1,4-butanediol diacrylate, 1,6-hexanediol diacrylate, diethylglycol diacrylate, triethylglycol diacrylate, trimethyl-propane triacrylate, penta-erythritol triacrylate, 2-hydroxyethyl acrylate, pentaerythritol tetrakis-(mercaptopropionate) (mercaptate Q 43 ester-milacron).

A system of low polarity solvents enables a mixture of acceptable viscosity for use as a printing ink to be obtained. This colour-producing compound (ink) is crushed in order to reduce the particle size to approximately 2.5 microns and thus secure the required resolution and speed of development. The viscosity of this composition is of the order of 3000 to 4000 cps (20° C.).

As an example, the composition of the colour-producing layer 3 may in practice be as follows:

| | | |
|---|---|---|
| a. | mixture of benzo-indolino-spiropyran compounds | 30.00% |
| b. | n-vinyl-2-pyrrolidone (VP) (GAF) | 25.00% |
| c. | ethyl hydroxyl cellulose (EHEC -Hercules) | 5.50% |
| d. | triethylbenzylcyanurate (sensitiser) | 0.70% |
| e. | methylene blue | 0.30% |
| f. | mixture of solvents | 38.50% |
| | TOTAL | 100.00% |

IV. Barrier element 4

The barrier layer or element 4 comprises a material which is inert with respect to the components of the colour-producing layer 3. Its purpose is to protect the latter and to prevent any accidental reaction of the same.

It comprises a mixture of photoactivators dispersed in a system of acrylic oligomers and copolymers.

For example, use may be made of one or more of the following substances, as photo-activators:

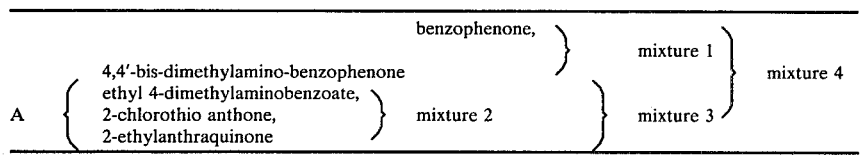

Amongst the acrylate resins, it is possible for example to make use of one or more of the following resins: polybutyl acrylate, ethylhexyl acrylate, iso-octyl acrylate, ethyl methacrylate, 2-ethylhexyl acrylate, dimethylamino-ethyl methacrylate, diacetone acrylamide, 1,4-butanediol diacrylate, 1,6-hexanediol diacrylate, diethylene glycol diacrylate, triethylene glycol diacrylate, trimethylol propane triacrylate, pentaerythritol triacrylate, 2-hydroxyethyl acrylate and pentaerythritol tetrakis (mercaptopropionate) (Q.43 ester).

Under the action of ultraviolet light, the release of free radicals on the one hand from the photo-initiators dispersed in the priming layer 2, as well as the photolytic decomposition of particular others of these agents on the other hand, leads in the presence of a hydrogen donor to the liberation of hydrochloric acid. This renders it possible:

(a) to initiate the exothermic photo-degradative polymerisation of the barrier layer 4,
(b) to bring about a specific intimate contact between the colour-producer 3 and the colour developer 5,
(c) to activate the electron exchange process consequent upon the pH drop resulting from the release of acid, and
(d) to introduce the colour developer into a liquid phase consequent upon the resulting exothermic reaction thus allowing absorption of and penetration in depth of the ingredients of the colour-producing composition 3 within the colour developer 5.

According to a particularly preferred embodiment, the composition of the barrier layer or element 4 may be as follows:

| | | |
|---|---|---|
| a. | solvents | 16.00% |
| b. | lumattin S 90 (detackifier) BASF | 1.00% |
| c. | EBBECRYL 593 (polyester acrylate) UCB | 53.00% |
| d. | EBECRYL 102 (amino-acrylate) UCB | 15.00% |
| e. | diacrylate of 1,4-butanediol | 5.00% |
| f. | diacrylate of oxyethylated bis-phenol A | 5.00% |
| g. | 85% phosphoric acid ($H_3PO_4$) | 0.70% |
| h. | mixture of photoactivators (such as given under A) | 4.30% |
| | TOTAL | 100.00% |

The three layers 1,3 and 4 of the donor complex c are evidently stable at room temperature and do not react in daylight. Only ultraviolet light of predetermined wavelength brings about the chemical reactions described above and thus the transfer of signs or symbols to the colour-producing layer 3.

V. Carrier 6 of the Receptor Complex c1

The composition of the support layer 6 of the receptor complex c1 corresponds substantially to that of the carrier 1 of the donor complex c described above under I.

The carrier 6 may be opaque or transparent to ultraviolet light depending upon the method of use intended. If it is desired to direct the light in the direction of the arrows G (FIG. 3) through the acceptor complex C1, the carrier 6 should be transparent whilst the carrier 1 may be opaque or transparent with respect to this light. On the other hand, if it is intended to direct the ultraviolet light in the direction of the arrows F (FIG. 3) through the donor complex c, the carrier 1 must be transparent whilst the carrier 6 may either be opaque or transparent to the light F.

According to one embodiment, the carrier 6 may comprise an optional element with a plane surface upon which is deposited, for example, by spraying in air, a uniform layer of the colour developer 5.

VI. Colour Developer 5

The colour developer 5 comprises an active agent, a bonding polymer, a thermoabsorptive agent, and a suitable solvent system.

The active agent may be an activated calcium compound, for example, one sold under one of the trade names SILTON, BENTONITE. COPISIL, ATTAPULGITE or ZEOLITE. It may comprise a paraphenylphenol resin, an aluminium and magnesium silicate or zinc salicylate or stearate. It may also be a mixture of two or more of these substances.

The bonding agent of the developer 5 has a low melting point and does not absorb ultraviolet light at wavelengths of the order of 254 to 436 nm. For example, it may be vinyl acetate or an analogous compound.

As solvent, it is possible to make use of water, alcohols, ketones, aromatic or aliphatic solvents, or mixtures of such solvents. The solvent system used has a low polarity thus enabling the layer 5 to be applied by roller to the carrier 6, or alternatively of spraying this mixture as an aerosol whilst using a suitable propellant.

The thermoabsorptive agent limits and controls heat propagation during the transfer, and it may for example consist of a gelatine.

The developer 5 may, for example, have the following composition:

| | | |
|---|---|---|
| a. | Composition of paraphenyl-phenol resins (active agent) | 30.00% |
| b. | Zinc salicylate/zinc stearate (active agent) | 2.00% |
| c. | Low-melting point non-crystalline wax | 12.00% |
| d. | Thermoabsorption agent | 3.00% |
| e. | Bonding polymer | 20.00% |
| f. | Low-polarity solvents | 33.00% |
| | TOTAL | 100.00% |

This composition is crushed in order to reduce the particle size thereof to a lesser value than 2.5 microns and thus ensure the required resolution and speed in the process of development.

Referring to FIG. 3, there will now be described the use of the transfer material in accordance with the invention comprising the donor complex c and the receptor complex c1 (FIG. 2).

The two surfaces respectively coated with the donor complex c and the receptor complex C1 are brought into contact with one another. The whole is then exposed to ultraviolet light of predetermined wavelength depending upon the chemical nature of the photosensitive materials. If only the carrier 1 is transparent to ultraviolet light, it should be incident in the direction F. If only the carrier 6 is transparent to ultraviolet rays, the light should be incident in the direction G. If both carriers 1 and 6 are transparent to ultraviolet light, it is immaterial whether it follows the direction F or G.

Due to the action of the ultraviolet light, the barrier layer 4 of the donor complex c is eliminated as a result of a photopolymerisation which simultaneously promotes electron exchange enabling development of colouring on the carrier 6. A localised exothermic reaction occurs at the irradiated surface enabling the colour-forming composition 3 to be brought into contact with the colour developer 5 which is present in the liquid phase. The two layers 3 and 5 interact to form an image 7 upon the carrier 6. The image or sign 7 is identical with that printed upon the layer 2 of the donor complex c by means of the colour-producing composition 3 ("ink").

In consequence of the reaction initiated by the ultraviolet light and in view of the small quantity of infra-red energy utilised, the action of the latter is localised and the sign or character 7 has a very high degree of definition, its quality being comparable to that of a printed character.

In general, the transfer process in accordance with the invention makes it possible to obtain images or imprints of a quality equal to that obtained by those processes involving an actual physical transfer of a material. The process is extremely rapid and does not entail any dissipation of heat. The complete elimination of mechanical movements during the transfer allows consideration of an automatic or semi-automatic system of operation making use of the two fundamental advantages of the invention, viz, the speed of operation and the complete lack of accidental transfer in the absence of ultraviolet light. Moreover, the invention makes it possible to produce transfers onto an optional smooth surface. In addition, the colour developer 5 may be sprayed on to an optional carrier and the transfer may then be effected by making use of a donor complex c.

Apart from its particular wavelength characteristic, the source of ultraviolet light may be of any suitable design. In particular, it may be in the form of a manual accessory of the fountain-pen type.

Figure 4:
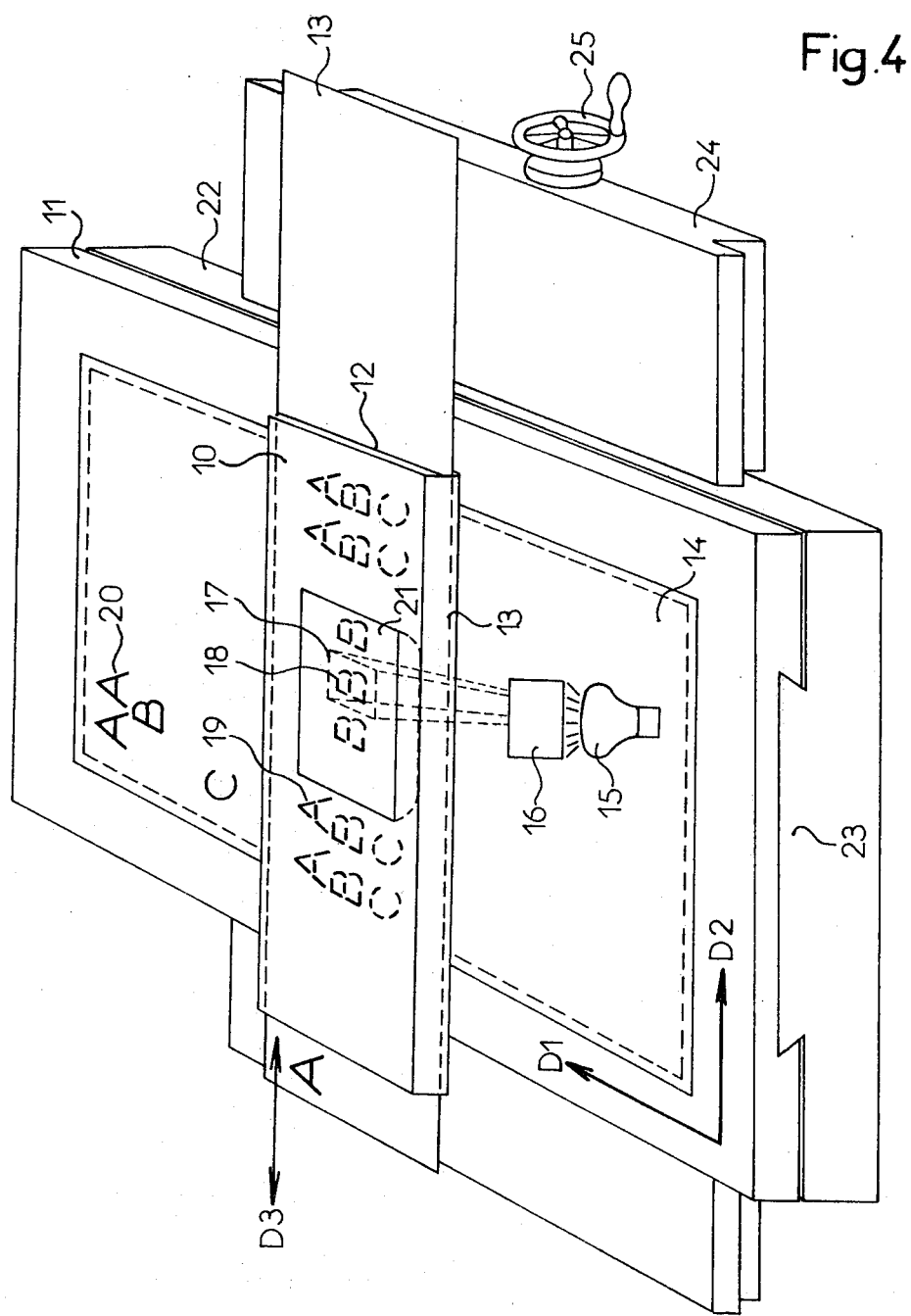
FIG. 4 is a diagrammatic perspective view of a device employing the transfer material illustrated in FIGS. 1 to 3.

A device for use with the transfer material and in the process in accordance with the invention, as described in the following and is sketchily illustrated in FIG. 4 of the drawings.

This device comprises a first supporting frame 10 and a second supporting frame 11, one located below the other. In proximity to its lower surface, the frame 10 has a slot or tunnel 12 passing through it from one side to the other: this is intended to receive a donor complex 13 comprising characters or symbols 18, 19 intended to be transferred. The donor complex 13 may be moved through the tunnel 12 in the directions of the arrow D3.

A receptor complex 14 is secured in suitable manner (not shown) to the supporting frame 11.

A stationary source 15 of ultraviolet light enables a beam 17 to be directed via a lens system 16 on to the donor and receptor complexes 13 and 14 and is located beneath the complex 14, and beneath the central part of the supporting element 10. The supporting frame 10 has an opening in its central part, in which opening is disposed in elastic manner a gripping device 21 which enables the donor complex 13 to be positioned upon the receptor complex 14 in the area of incidence of the beam of ultraviolet light 17.

The frame 11 is moveable in the directions of the arrows D1 and D2 for this purpose it is slidably mounted upon a first guide means 22 having a dovetailed projection 23, and which, in turn is slidably mounted upon a transverse guide 24 operated in known manner by a handwheel 25.

When using this device, the part of the receptor complex 14 which is intended to receive a symbol is first located beneath the central opening in the element 10 in the area in which the beam 17 is incident. This is performed by turning the handwheel 25 and moving the frame 11 along the guide means 22. The donor complex 13 is then moved through the tunnel 12 so that a sign which is to be transferred, for example 18, is located within the field of the incident beam 17. After these positioning steps, the clamping element 21 is pushed downwards so as to bring the donor complex 13 closely into contact with the receptor complex 14, and the source 15 of ultraviolet light is then operated for a predetermined period. Under the action of this light, the character 18 is transferred onto the receptor complex 14 in the manner described above.

The guiding and positioning means for the supporting elements 10 and 11 may evidently be made of known semi-automatic or automatic means which are within the skill of one versed in the art and are consequently not shown.

The invention is not limited to the specific forms described and illustrated herein, and numerous modifications may be made therein.

I claim:

1. A dry transfer material for the production of a coloured image which comprises (a) a first inert carrier having a colour-producing coating containing a chromogenic substance upon one side thereof, and (b) a second inert carrier having a coating comprising a colour developer upon one side thereof, said chromogenic substance being adapted to emit electrons and said colour developer is an electron-accepting compound, said transfer material being characterised (i) in that said colour-producing coating is a discontinuous coating which is present in the form of the images which are to be transferred, which discontinuous coating is coated upon its outer side with a barrier layer of a material which is degradable by the action thereon of ultraviolet light of predetermined wavelength and comprises a mixture of photoactivators dispersed in a system of acrylic oligomers and copolymers and and (ii) in that a priming layer which is interposed between said first inert carrier and said discontinuous colour-producing coating and comprises a mixture of copolymers of polyvinyl-pyrrolidone, maleic anhydryde and of a polyvinyl alcohol in which is dispersed a photoinitiator or a mixture of such materials and (iii) in that at least one of said first and second inert carriers is transparent to ultraviolet light of said predetermined wavelength under action of ultraviolet light of specific wavelength said photoinitiators bringing about a photopolymerisation with the acrylic oligomers or copolymers of the barrier layer and releasing free radicals what leads in presence of hydrogen donor to the liberation of hydrochloric acid permitting following action:
(a) to initiate the exothermic photo-degradative polymerisation of said barrier layer,
(b) to bring about a specific intimate contact between said colour-producing creating and said colour developer,
(c) to activate the electron exchange process consequent upon the pH drop resulting from the release of acid, and
(d) to introduce said colour developer into a liquid phase consequent upon the resulting exothermic reaction thus allowing absorption of and penetration in depth of the ingredients of said colour-producing composition within said colour developer.

2. Transfer material as claimed in claim 1 in which said chromogenic substance comprises at least one substance of the benzo-indolino-spiropyran series.

3. Transfer material as claimed in claim 1 in which said colour-producing coating additionally comprises a bonding polymer which activates the photopolymerisation which occurs under the action of said ultraviolet light.

4. Transfer material as claimed in claim 1 in which said colour-producing coating additionally comprises a dyestuff which is bleached by the action of ultraviolet light thereon.

5. Transfer material as claimed in claim 1 in which said coating comprising a colour developer additionally comprises a zinc compound which acts as a photo-activator therefor.

6. Transfer material as claimed in claim 1 in which said coating comprising a colour developer additionally comprises a bonding polymer and a thermoabsorptive agent.

7. Transfer material as claimed in claim 1 in which said priming layer comprises a mixture of a copolymer of polyvinyl-pyrrolidine/maleic anhydride and a polyvinyl alcohol.

8. Transfer material as claimed in claim 1 in which said barrier layer comprises a mixture of oligoners, acrylic copolymers and photo-activators.

9. Transfer material as claimed in claim 1 in which said priming layer has been deposited upon said first inert carrier by roller coating and said discontinuous colour-producing coating has been produced by a printing process.

10. Transfer material as claimed in claim 9 in which said colour-producing coating has been produced by screen printing.

11. Transfer material as claimed in claim 1 in which said colour developer has been applied to said second inert carrier by an aerosol technique.

* * * * *